US009070597B2

United States Patent
Ahn et al.

(10) Patent No.: US 9,070,597 B2
(45) Date of Patent: Jun. 30, 2015

(54) THIN FILM TRANSISTOR, DISPLAY SUBSTRATE AND METHOD OF MANUFACTURING A THIN FILM TRANSISTOR

(71) Applicants: Samsung Display Co., Ltd., Yongin, Gyeonggi-Do (KR); Kobe Steel, LTD., Kobe-shi, Hyogo (JP)

(72) Inventors: Byung-Du Ahn, Hwaseong-si (KR); Gun-Hee Kim, Hwaseong-si (KR); Jun-Hyung Lim, Seoul (KR); Toshihiro Kugimiya, Kobe (JP); Hiroshi Goto, Kobe (JP); Aya Miki, Kobe (JP); Shinya Morita, Kobe (JP)

(73) Assignees: SAMSUNG DISPLAY CO., LTD. (KR); KOBE STEEL, LTD. (JP)

( * ) Notice: Subject to any disclaimer, the term of this patent is extended or adjusted under 35 U.S.C. 154(b) by 0 days.

(21) Appl. No.: 14/262,769

(22) Filed: Apr. 27, 2014

(65) Prior Publication Data

US 2014/0346498 A1 Nov. 27, 2014

(30) Foreign Application Priority Data

May 23, 2013 (KR) ........................ 10-2013-0058272

(51) Int. Cl.
*H01L 29/00* (2006.01)
*H01L 27/12* (2006.01)
*H01L 29/786* (2006.01)
*H01L 29/66* (2006.01)

(52) U.S. Cl.
CPC ...... *H01L 27/1225* (2013.01); *H01L 29/78693* (2013.01); *H01L 29/66969* (2013.01)

(58) Field of Classification Search
None
See application file for complete search history.

(56) References Cited

U.S. PATENT DOCUMENTS

| 7,838,348 | B2 | 11/2010 | Hoffman et al. | |
| 7,906,777 | B2 | 3/2011 | Yano et al. | |
| 7,998,372 | B2 | 8/2011 | Yano et al. | |
| 8,101,949 | B2 | 1/2012 | Ye | |
| 8,343,800 | B2 | 1/2013 | Umeda et al. | |
| 2011/0227064 | A1* | 9/2011 | Park et al. | 257/43 |
| 2011/0260121 | A1 | 10/2011 | Yano et al. | |
| 2012/0025148 | A1* | 2/2012 | Uchiyama et al. | 252/506 |
| 2012/0061673 | A1 | 3/2012 | Yamazaki et al. | |
| 2012/0064650 | A1 | 3/2012 | Yamazaki et al. | |

FOREIGN PATENT DOCUMENTS

JP 2011-091365 A 5/2011

OTHER PUBLICATIONS

M S Grover, P A Hersh, H Q Chiang, E S Kettenring, J FWager and D A Keszler, "Thin-film transistors with transparent amorphous zinc indium tin oxide channel layer", IOP Publishing Ltd, J. Phys. D: Appl. Phys. 40 (2007) 1335-1338.*

* cited by examiner

*Primary Examiner* — David Vu
*Assistant Examiner* — Cuong Nguyen
(74) *Attorney, Agent, or Firm* — Cantor Colburn LLP

(57) ABSTRACT

A thin film transistor includes a gate electrode, a channel overlapped with the gate electrode, a source electrode contacting the channel, and a drain electrode spaced apart from the source electrode and contacting the channel. The channel includes indium-zinc-tin oxide sourced from a source including a single phase indium-zinc-tin oxide.

16 Claims, 9 Drawing Sheets

THIN FILM TRANSISTOR, DISPLAY SUBSTRATE AND METHOD OF MANUFACTURING A THIN FILM TRANSISTOR

This application claims priority to Korean Patent Application No. 10-2013-0058272, filed on May 23, 2013, and all the benefits accruing therefrom under 35 U.S.C. §119, the contents of which application are herein incorporated by reference in their entirety.

BACKGROUND

1. Field

The invention relates to a thin film transistor. More particularly, the invention relates to a thin film transistor including an oxide semiconductor, a display substrate including the thin film transistor and a method of manufacturing the thin film transistor.

2. Description of Related Art

Generally, a thin film transistor for driving a pixel in a display device includes a gate electrode, a source electrode, a drain electrode, and an active pattern forming a channel between the source electrode and the drain electrode. The active pattern includes a semiconductor layer including amorphous silicon, polycrystalline silicon, oxide semiconductor, or the like.

Amorphous silicon has a relatively low electron mobility, which may be about 1 square centimeter per volt second ($cm^2/V \cdot s$) to about 10 $cm^2/V \cdot s$, so that a thin film transistor including amorphous silicon has relatively low driving characteristics. In contrast, polycrystalline silicon has a relatively high electron mobility, which may be about 10 $cm^2/V$ to about hundreds $cm^2/V$. However, a crystallization process is required for forming polycrystalline silicon. Thus, forming a uniform polycrystalline silicon layer on a large-sized substrate may be difficult, and resulting manufacturing costs are high. Oxide semiconductors may be formed through a low-temperature process, may be easily formed in a large-scale, and have a high electron mobility. Thus, research is actively being conducted on thin film transistors which include an oxide semiconductor.

SUMMARY

One or more exemplary embodiment provides a thin film transistor having improved reliability One or more exemplary embodiment provides a display substrate including the thin film transistor.

One or more exemplary embodiment provides a method of manufacturing the thin film transistor.

According to an exemplary embodiment, a thin film transistor includes a gate electrode, a channel overlapped with the gate electrode, a source electrode contacting the channel, and a drain electrode spaced apart from the source electrode and contacting the channel. The channel includes indium-zinc-tin oxide sourced from a source including a single phase indium-zinc-tin oxide.

In an exemplary embodiment, the indium-zinc-tin oxide of the channel is amorphous.

In an exemplary embodiment, the single phase indium-zinc-tin oxide of the source is crystalline.

In an exemplary embodiment, the indium-zinc-tin oxide of the source is represented by the following Chemical Formula 1.

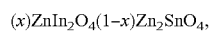$ZnIn_2O_4(1-x)$$Zn_2SnO_4$,  Chemical Formula 1 wherein (0<x<0.45)

In an exemplary embodiment, the electron mobility of the channel is about 10 square centimeter per volt second ($cm^2/V \cdot s$) to about 40 $cm^2/V \cdot s$.

According to an exemplary embodiment, a display substrate includes a gate electrode, a channel overlapped with the gate electrode, a source electrode contacting the channel, a drain electrode spaced apart from the source electrode and contacting the channel, and a pixel electrode electrically connected to the drain electrode. The channel includes indium-zinc-tin oxide sourced from a source including a single phase indium-zinc-tin oxide.

In an exemplary embodiment, the gate electrode is between the base substrate and the channel.

In an exemplary embodiment, the display substrate further includes an etch stopper on the channel, and the source and the drain electrodes partially cover the etch stopper.

In an exemplary embodiment, the channel is between the gate electrode and the base substrate, and the channel, the source electrode and the drain electrode are in a same layer of the display substrate.

According to an exemplary embodiment, a method for manufacturing a thin film transistor is provided. According to the method, an oxide semiconductor layer is provided from a source including a single phase indium-zinc-tin oxide. The oxide semiconductor layer is patterned to form a channel of the thin film transistor.

In an exemplary embodiment, the providing the oxide semiconductor layer comprises vapor deposition of the source.

In an exemplary embodiment, the method may further comprise annealing the oxide semiconductor layer at a temperature of about 100 degrees Celsius (° C.) to about 700° C.

BRIEF DESCRIPTION OF THE DRAWINGS

The above and other features and advantages will become more apparent by describing exemplary embodiments thereof with reference to the accompanying drawings, in which.

DETAILED DESCRIPTION

Figure 1:
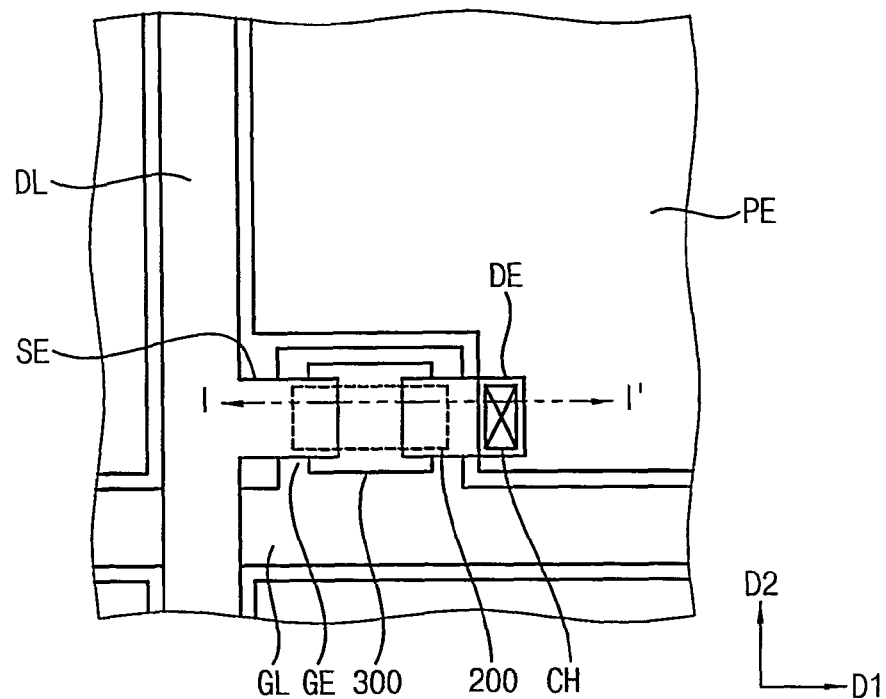
FIG. 1 is a plan view illustrating an exemplary embodiment of a display substrate according to the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms.

These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The active pattern of a thin film transistor used in a display device, includes a semiconductor layer which may include an oxide semiconductor. Oxide semiconductors may be chemically changed in an annealing process or may be damaged in a process of forming an input electrode and an output electrode. Thus, maintaining uniform electrical characteristics of a thin film transistor including the oxide semiconductor may be difficult. Therefore, there remains a need for an improved thin film transistor which resists change and/or damage during a manufacturing process thereof and maintains electrical characteristics thereof through such manufacturing process.

Hereinafter, exemplary embodiments of the invention will be explained in detail with reference to the accompanying drawings.

Figure 2:
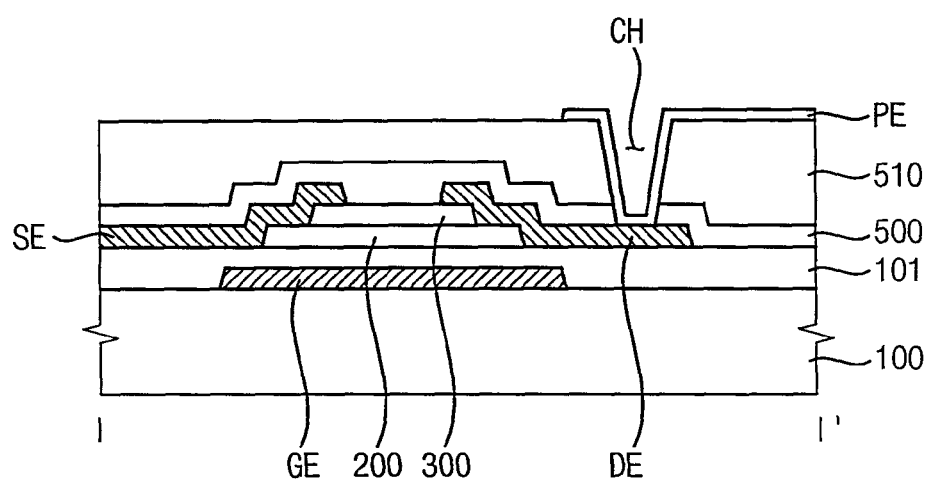
FIG. 2 is a cross-sectional view taken along line I-I' of FIG. 1.
Figure 3:
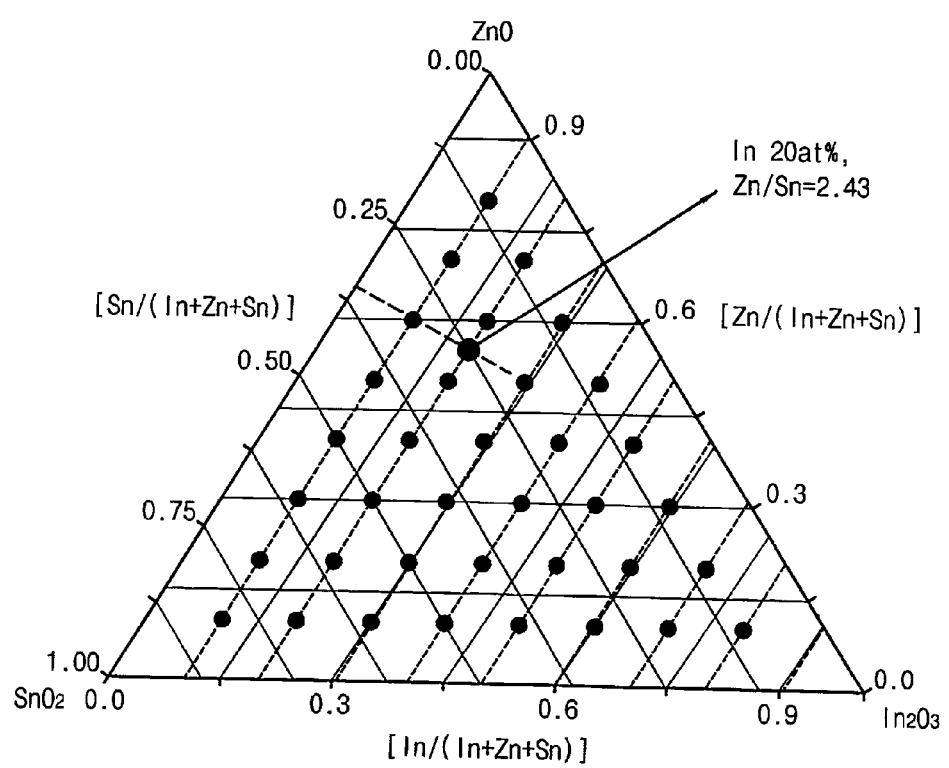
FIG. 3 is a phase diagram of an exemplary embodiment of an oxide semiconductor used for a channel of a display substrate according to the invention.

FIG. 1 is a plan view illustrating an exemplary embodiment of a display substrate according to the invention. FIG. 2 is a cross-sectional view taken along line I-I' of FIG. 1. FIG. 3 is a phase diagram of an exemplary embodiment of an oxide semiconductor used for a channel of a display substrate according to the invention.

Referring to FIGS. 1 and 2, an exemplary embodiment of a display substrate according to the invention includes a base substrate 100, a gate line GL, a data line DL, a gate insulation layer 101, a thin film transistor, a passivation layer 500, an organic insulation layer 510 and a pixel electrode PE. The thin film transistor includes a gate electrode GE, a channel 200, an etch stopper 300, a source electrode SE and a drain electrode DE.

The gate line GL extends in a first direction D1, and the data line DL extends in a second direction D2, in a plan view. The first direction D1 crosses the second direction D2. In one exemplary embodiment, for example, the first direction D1 may be substantially perpendicular to the second direction D2, but the invention is not limited thereto or thereby.

The gate line GL is physically and/or electrically connected to the gate electrode GE. In one exemplary embodiment, for example, the gate electrode GE may protrude from the gate line GL in the second direction D2.

The channel 200 overlaps with the gate electrode GE. The source electrode SE and the drain electrode DE are spaced apart from each other, and contact the channel 200, respectively. The etch stopper 300 is disposed on the channel 200. The source electrode SE and the drain electrode DE partially cover the etch stopper 300. In another exemplary embodiment, the etch stopper 300 may be omitted.

The data line DL is physically and/or electrically connected to the source electrode SE. In one exemplary embodiment, for example, the source electrode SE may protrude from the data line DL in the first direction D1.

The gate insulation layer 101 covers the gate electrode GE, and the channel 200 is disposed on the gate insulation layer 101.

The passivation layer 500 covers the thin film transistor, and the organic insulation layer 510 is disposed on the passivation layer 500. The pixel electrode PE is disposed on the organic insulation layer 510, and is connected to the drain electrode DE through a contact hole CH defined in the passivation layer 500 and the organic insulation layer 510.

The channel 200 includes an oxide semiconductor. Particularly, the channel 200 includes indium-zinc-tin oxide ("IZTO"). The IZTO in the channel 200 may be amorphous.

In an exemplary embodiment of manufacturing the oxide semiconductor, the oxide semiconductor is formed from a source including IZTO oxide having a single phase. A composition of the IZTO may be represented by a phase diagram of ZnO, SnO$_2$ and In$_2$O$_3$ as shown in FIG. 3. The single phase IZTO may be formed from a specific composition range. The composition range of the single phase IZTO is represented by Chemical Formula 1.

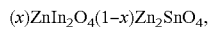

$(x)\text{ZnIn}_2\text{O}_4(1-x)\text{Zn}_2\text{SnO}_4$,  Chemical Formula 1 where 0<x<0.45

As shown in FIG. 3, when an amount of indium is about 20 atomic percentage (at %) and when an atom ratio of Zn/Sn is about 2.43, the single phase IZTO may be obtained.

The oxide semiconductor formed from the single phase IZTO has a higher heat stability than an oxide semiconductor formed from IZTO having a multi-phase. Thus, a composition range of the oxide semiconductor formed from the single phase IZTO may be maintained in an annealing process of in a method of forming a channel or in a following process of the method. Thus, a reliability of a thin film transistor may be improved. In an exemplary embodiment, the oxide semiconductor (e.g., a channel) comprises an IZTO represented by Chemical Formula 1. In an exemplary embodiment, the oxide semiconductor is a single phase IZTO represented by Chemical Formula 1.

Furthermore, the oxide semiconductor formed from the single phase IZTO has a high photo stability, and a high electron mobility, for example, of about 10 square centimeter per volt second (cm$^2$/V·s) to about 40 cm$^2$/V·s.

FIGS. 4 to 8 are cross-sectional views illustrating an exemplary embodiment of a method of manufacturing the display substrate illustrated in FIGS. 1 and 2. An exemplary embodiment of a method of manufacturing a thin film transistor according to the invention may correspond to processes for forming a thin film transistor in the display substrate.

Figure 4:
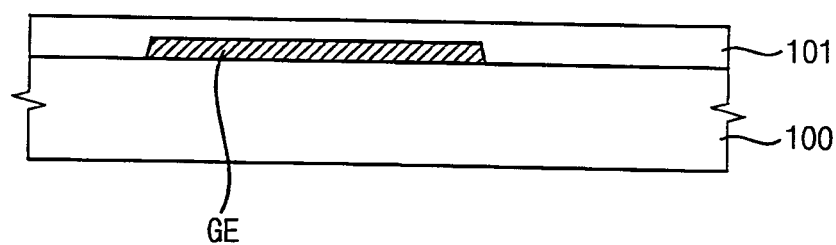
FIGS. 4 to 8 are cross-sectional views illustrating an exemplary embodiment of a method of manufacturing the display substrate illustrated in FIGS. 1 and 2.

Referring to FIG. 4, a gate line and a gate electrode GE are formed (e.g., provided) on the base substrate 100. In one exemplary embodiment, for example, a gate metal layer is formed on the base substrate 100, and patterned to form the gate line and the gate electrode GE. Examples of the base substrate 100 may include a glass substrate, a quartz substrate, a silicon substrate, a plastic substrate and the like.

Examples of a material that may be used for the gate metal layer may include copper, silver, chromium, molybdenum, aluminum, titanium, manganese, alloy thereof and the like. The gate metal layer may have a single-layered structure, or a multi-layered structure including a plurality of metal layers including different metals. In one exemplary embodiment, for example, the gate metal layer may include a copper layer, and a titanium layer disposed under and/or on the copper layer.

In another exemplary embodiment, the gate metal layer may include a metal layer, and an oxide layer disposed under and/or on the metal layer. In one exemplary embodiment, for example, the gate metal layer may include a copper layer, and an oxide layer disposed under and/or on the copper layer. The oxide layer may include indium-zinc oxide ("IZO"), indium-tin oxide ("ITO"), gallium-zinc oxide ("GZO"), zinc-aluminum oxide ("ZAO") or the like.

Thereafter, a gate insulation layer 101 is formed to cover the gate line and the gate electrode GE. Examples of a material that may be used for the gate insulation layer 101 may include silicon oxide, silicon nitride and the like.

Figure 5:
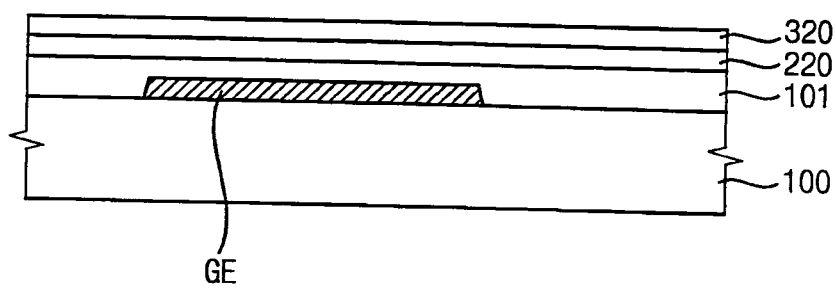

Referring to FIG. 5, an oxide semiconductor material layer 220 and an inorganic insulation material layer 320 are formed on the gate insulation layer 101.

The oxide semiconductor layer 220 may be formed through conventional methods for forming an oxide semiconductor layer. In one exemplary embodiment, the oxide semiconductor layer 220 is formed through a physical vapor deposition method such as a vacuum deposition method or a sputtering method.

In one exemplary embodiment, for example, a source having a similar composition to the oxide semiconductor material layer 220 may be used for forming the oxide semiconductor layer 220. The source may be used as a target in the sputtering method. In one exemplary embodiment, for example, when the sputtering method is used, a target includes IZTO oxide having a single phase. Thus, the IZTO of the target has a composition represented by Chemical Formula 1. The IZTO of the target may be crystalline and may have spinel phase. Thus, the oxide semiconductor material layer 220 formed from the target including the single phase IZTO may have a composition represented by Chemical Formula 1, and may be amorphous.

In an exemplary embodiment, an annealing process may be further performed to heat the oxide semiconductor material layer 220. In one exemplary embodiment, or example, the annealing process may be performed at about 100 degrees Celsius (° C.) to about 700° C., and more specifically at about 300° C. to about 400° C. The annealing process may improve electrical characteristics of the oxide semiconductor material layer 220.

The inorganic insulation material layer 320 may include silicon oxide. When the display substrate does not include an etch stopper, the inorganic insulation material layer 320 may be omitted.

Figure 6:
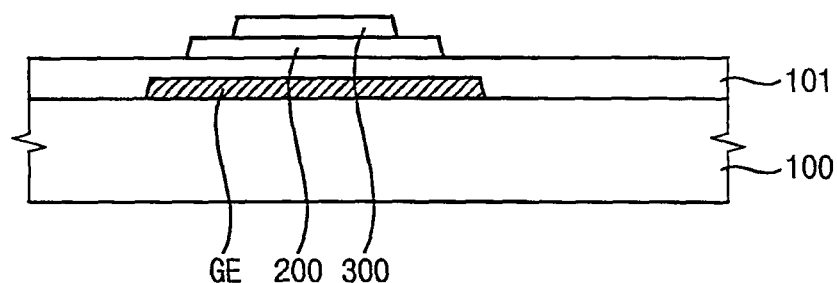

Referring to FIG. 6, the oxide semiconductor material layer 220 and the inorganic insulation material layer 320 are patterned to form a channel 200 and an etch stopper 300, respectively. In one exemplary embodiment, for example, the etch stopper 300 may have a smaller size than the channel 200, in a plan view. A portion of the channel 200 may be exposed by the etch stopper 300. In an exemplary embodiment, the etch stopper 300 and the channel 200 may be formed by using a same mask.

Figure 7:
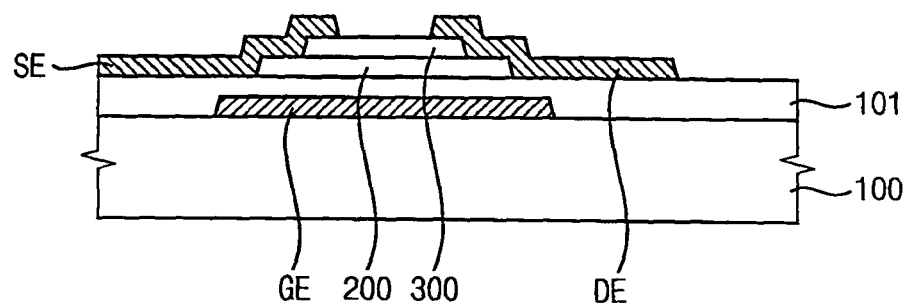

Referring to FIG. 7, a data line, a source electrode SE and a drain electrode DE are formed. Particularly, a data metal layer covering the etch stopper 300 and the channel 200 is formed and patterned to form the data line, the source electrode SE and the drain electrode DE.

Examples of a material that may be used for the data metal layer may include copper, silver, chromium, molybdenum, aluminum, titanium, manganese, alloy thereof and the like. The data metal layer may have a single-layered structure, or a multi-layered structure including a plurality of metal layers including different metals.

The source electrode SE and the drain electrode DE respectively contact opposing ends of the channel 200, which are not covered (e.g., overlapped) by the etch stopper 300. The are source electrode SE and the drain electrode DE are spaced apart from each other to expose a portion of the etch stopper 300.

Figure 8:
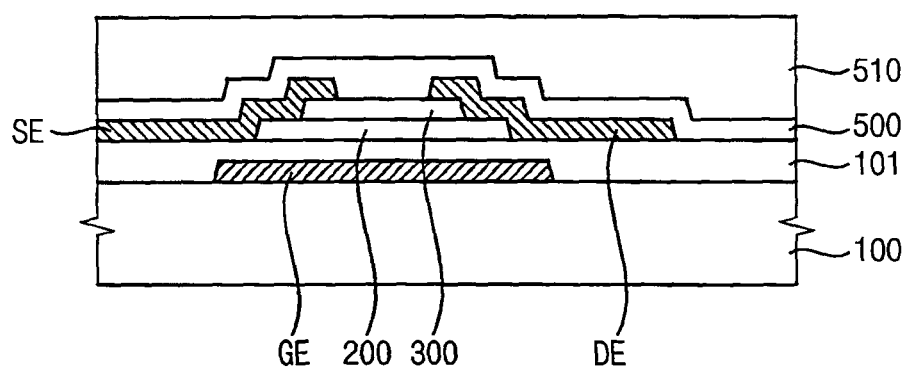

Referring to FIG. 8, a passivation layer 500 is formed to cover the source electrode SE, the drain electrode DE and the etch stopper 300, and an organic insulation layer 510 is formed to cover the passivation layer 500.

The passivation layer 500 includes an inorganic material. Examples of a material that may be used for the passivation layer 500 may include silicon oxide, silicon nitride and the like.

The organic insulation layer 510 includes an organic material. The organic insulation layer 510 planarizes a surface of the display substrate. In an exemplary embodiment, a photoresist composition may be spin-coated on the passivation layer 500 to form the organic insulation layer 510.

Thereafter, referring again to FIGS. 1 and 2, a contact hole CH is defined in the organic insulation layer 510 and the passivation layer 500 to expose the drain electrode DE, and a transparent conductive material layer is formed on the organic insulation layer 510. The transparent conductive material layer includes a transparent conductive material such as ITO, IZO or the like. A portion of the transparent conductive material layer contacts the drain electrode DE through the contact hole.

Thereafter, the transparent conductive layer is patterned to form the pixel electrode PE illustrated in FIG. 2.

In the illustrated exemplary embodiment, the thin film transistor of the display substrate has a bottom-gate structure in which a gate electrode is disposed under a channel. In another exemplary embodiment, a thin film transistor of a display substrate may have a top-gate structure in which a gate electrode is disposed on a channel Hereinafter, a display substrate having a thin film transistor having the top-gate structure will be explained.

Figure 9:
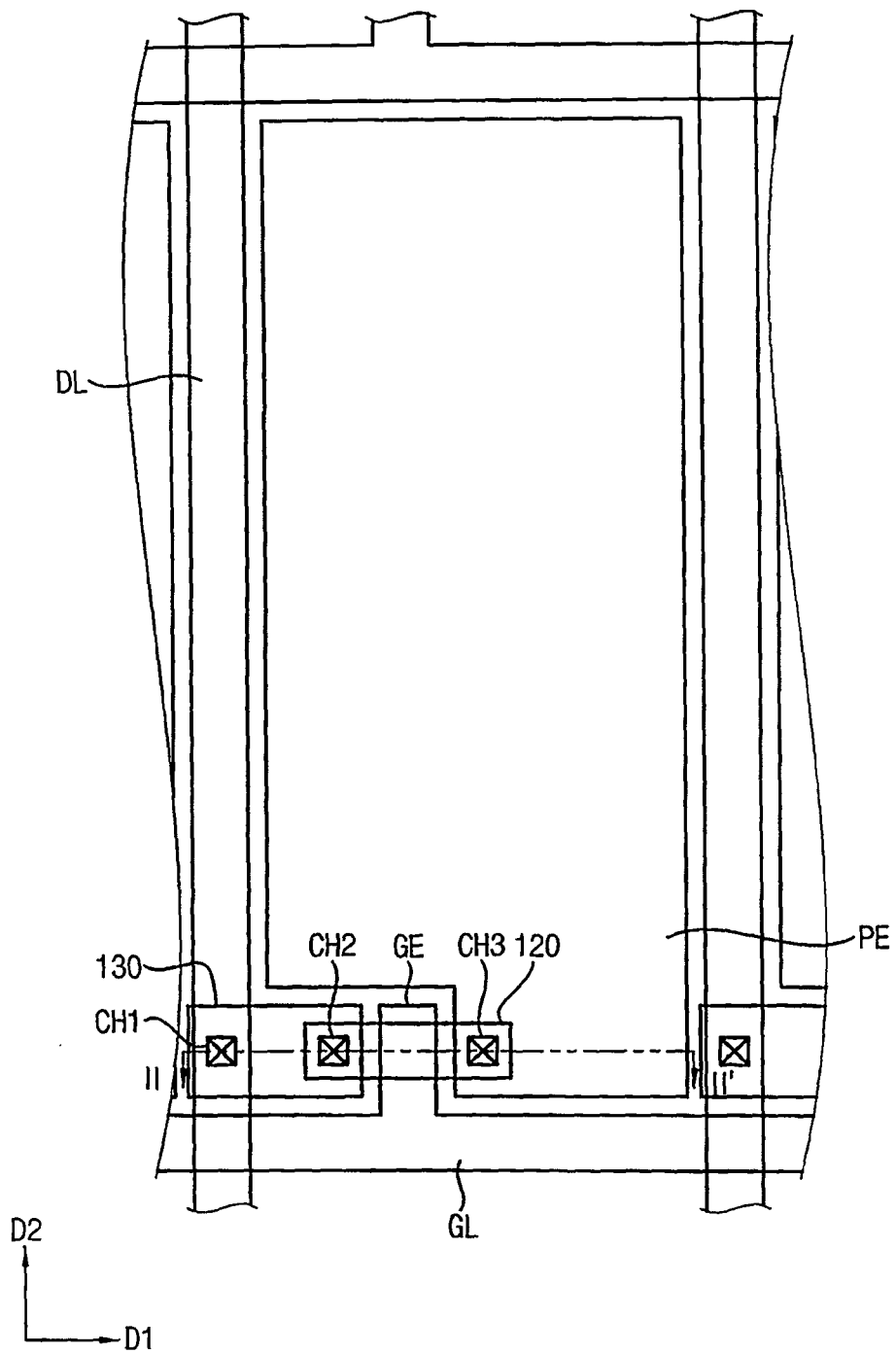
FIG. 9 is a plan view illustrating another exemplary embodiment of a display substrate according to the invention.
Figure 10:
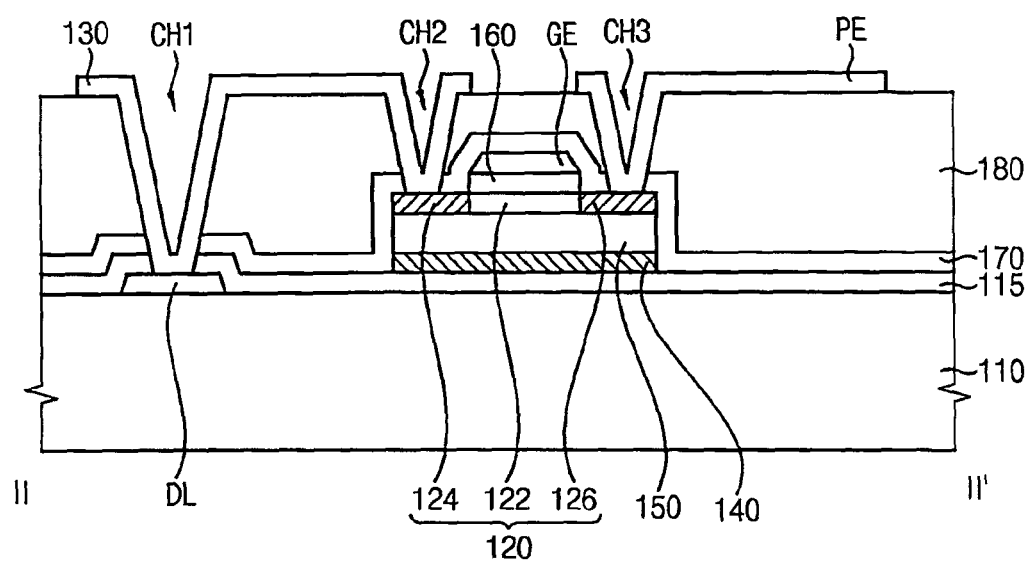
FIG. 10 is a cross-sectional view taken along line II-II' of FIG. 9.

FIG. 9 is a plan view illustrating another exemplary embodiment of a display substrate according to the invention. FIG. 10 is a cross-sectional view taken along line II-II' of FIG. 9.

Referring to FIGS. 9 and 10, a display substrate includes a base substrate 110, a gate line GL, a data line DL, an active pattern 120 and a light-blocking pattern 140.

The gate line GL extends in a first direction D1, and the data line DL extends in a second direction D2, in a plan view. The first direction D1 crosses the second direction D2. In one exemplary embodiment, for example, the first direction D1 may be substantially perpendicular to the second direction D2, but the invention is not limited thereto or thereby.

The gate line GL is electrically connected to the gate electrode GE. In one exemplary embodiment, for example, the gate electrode GE may protrude from the gate line GL in the second direction D2.

The active pattern 120 includes a channel 122, a source electrode 124 and a drain electrode 126. The channel 122, the source electrode 124 and the drain electrode 126 are in and/or on a same layer of the display substrate, and consecutively disposed in the same layer. The channel 122 is disposed between the source electrode 124 and the drain electrode 126.

The channel 122 includes an oxide semiconductor. Particularly, the channel 122 includes IZTO. The IZTO in the channel 122 may be amorphous.

In an exemplary embodiment of manufacturing the oxide semiconductor, the oxide semiconductor is formed from a source including IZTO having a single phase. Composition of the IZTO may be represented by a phase diagram of ZnO, $SnO_2$ and $In_2O_3$ as shown in FIG. 3. The single phase IZTO may be formed from a specific composition range. The composition range of the single phase IZTO is represented by Chemical Formula 1.

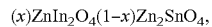

$(x)ZnIn_2O_4(1-x)Zn_2SnO_4$,  Chemical Formula 1 where $0 < x < 0.45$

The channel 122, the source electrode 124 and the drain electrode 126 are formed from a same oxide semiconductor material layer. In one exemplary embodiment, for example, a portion of the oxide semiconductor material layer is reduced and converted into a metallic conductor to form the source electrode 124 and the drain electrode 126.

The channel 122 overlaps with the gate electrode GE. Particularly, the gate electrode GE is disposed on the channel 122, and a gate insulation pattern 160 is disposed between the gate electrode GE and the channel 122. The gate electrode GE may entirely cover the channel 122 in the plan view.

In the illustrated exemplary embodiment, a planar size of the gate electrode GE may be equal to or greater than a size of the channel 122 in the plan view.

In the illustrated exemplary embodiment, the display substrate includes a pixel electrode PE connected to the drain electrode 126.

The data line DL is disposed on the base substrate 110, and is physically and/or electrically connected to the source electrode 124. In one exemplary embodiment, for example, the data line DL may be electrically connected to the source electrode 124 through a conductive connection electrode 130. A data insulation layer 115 is disposed on the base substrate 110 and the data line DL to cover the data line DL.

The display substrate includes a passivation layer 170 covering the thin film transistor and the data insulation layer 115, and an organic insulation layer 180 disposed on the passivation layer 170. The pixel electrode PE and the connection electrode 130 are disposed on the organic insulation layer 180.

In the illustrated exemplary embodiment, the data line DL is disposed directly on the base substrate 110, but the invention is not limited thereto or thereby. In another exemplary embodiment, the data line DL may be disposed on the passivation layer 170 such that the passivation layer 170 is between the date line DL and the base substrate 110.

The connection electrode 130 is physically and/or electrically connected to the data line DL through a first contact hole CH1 defined in the organic insulation layer 180, the passivation layer 170 and the data insulation layer 115, and is physically and/or electrically connected to the source electrode 124 through a second contact hole CH2 defined in the organic insulation layer 180 and the passivation layer 170. The pixel electrode PE is connected to the drain electrode 126 through a third contact hole CH3 defined in the organic insulation layer 180 and the passivation layer 170.

The light-blocking pattern 140 is disposed under the channel 122. The light-blocking pattern 140 covers a rear surface of the channel 122 so that entry of an external light to the channel 122 is reduced or effectively prevented. The light-blocking pattern 140 overlaps with an entire portion of the active pattern 120 in the plan view, including the channel, and an entire portion of the gate electrode GE. That is, when a portion of the gate electrode GE is not overlapped with the channel 122, the light-blocking pattern 140 overlaps with the portion of the gate electrode GE as well as the channel 122. Thus, the portion of the gate electrode GE may have a greater size than the active pattern 120 in a plan view. In the illustrated exemplary embodiment, a buffer pattern 150 is disposed between the light-blocking pattern 140 and the active pattern 120. The light-blocking pattern 140 is disposed on the data insulation layer 115.

In an exemplary embodiment, for example, the light-blocking pattern 140 may include at least one of a metal, a metal alloy, an insulating inorganic material and an organic material, and a combination thereof. In one exemplary embodiment, the light-blocking pattern 140 may include at least one of silicon-germanium alloy, germanium and titanium oxide, and a combination thereof. In one exemplary embodiment, the light-blocking pattern 140 may include silicon-germanium alloy.

When the light-blocking pattern 140 includes silicon-germanium alloy, the silicon-germanium alloy may be amorphous. The light-blocking pattern 140 may have a single-layered structure including a silicon-germanium alloy layer, or a multi-layered structure including a silicon-germanium alloy layer and a germanium layer. The germanium layer may be above or under the silicon-germanium alloy layer.

The cross-sectional thickness of the light-blocking pattern 140 may be about 100 angstroms (Å) to about 2,000 Å. When the cross-sectional thickness of the light-blocking pattern 140 is less than about 100 Å, electrical characteristics of the channel may be deteriorated. When the cross-sectional thickness of the light-blocking pattern 140 is more than about 2,000 Å, a signal may be delayed by a capacitance formed by the source electrode 124 or the drain electrode 126, with the light-blocking pattern 140.

In an exemplary embodiment, the cross-sectional thickness of the light-blocking pattern 140 may be about 600 Å to about 2,000 Å. When the cross-sectional thickness of the light-blocking pattern 140 is more than about 600 Å, the light-blocking pattern 140 may have a high optical density.

In another exemplary embodiment, the light-blocking pattern 140 may be omitted. Furthermore, the buffer pattern 150 may be omitted so that the active pattern 120 is disposed directly on the data insulation layer 115.

The buffer pattern 150 may include silicon oxide.

In another exemplary embodiment, a buffer layer may be further disposed between the base substrate 110 and the light-blocking pattern 140. The data line DL may be disposed directly on the base substrate 110 or on the buffer layer.

The exemplary embodiments of a display substrate according to the invention may be used for a liquid crystal display ("LCD") or an organic light-emitting diode ("OLED) display.

Hereinafter, effects of an exemplary embodiment of a thin film transistor according to the invention will be explained with reference to specific Examples and Comparative Examples.

EXPERIMENT 1

Forming an IZTO layer

Targets having IZTO were prepared according to the following Table 1. Through electron probe micro analysis, the targets of Examples 1 and 2 were confirmed to have a uniform single phase, and the target of Comparative Example 1 was confirmed to have a multiple phase. Semiconductor layers including IZTO were formed through a sputtering process using the targets of Examples 1 and 2 and Comparative Example 1. Thereafter, the semiconductor layers were annealed at about 300° C. for about 1 hour. Composition variation of the semiconductor layers are detailed in the following Table 1.

TABLE 1

|  | Target composition (In:Zn:Sn) | Composition of semiconductor layer before annealing (In:Zn:Sn) | Composition of semiconductor layer after annealing (In:Zn:Sn) |
| --- | --- | --- | --- |
| Example 1 | 20:56.7:23.3 | 21.9:51.5:26.7 | 21.8:51.5:26.7 |
| Example 2 | 13:60:27 | 14:55:31 | 14:55:31 |
| Comparative Example 1 | 20:48:32 | 19.8:47.6:32.5 | 19.3:46.2:34.5 |

Referring to Table 1, composition of the semiconductor layers of Examples 1 and 2 was not significantly changed after the annealing process. However, composition of the semiconductor layer of Comparative Example 1 was significantly changed after the annealing process. Thus, it can be noted that one or more exemplary embodiment of the invention may uniformly maintain composition of a semiconductor layer.

Figure 11:
FIG. 11 is a photograph showing a surface of the target of Example 1 after a sputtering process for 20 hours.
Figure 12:
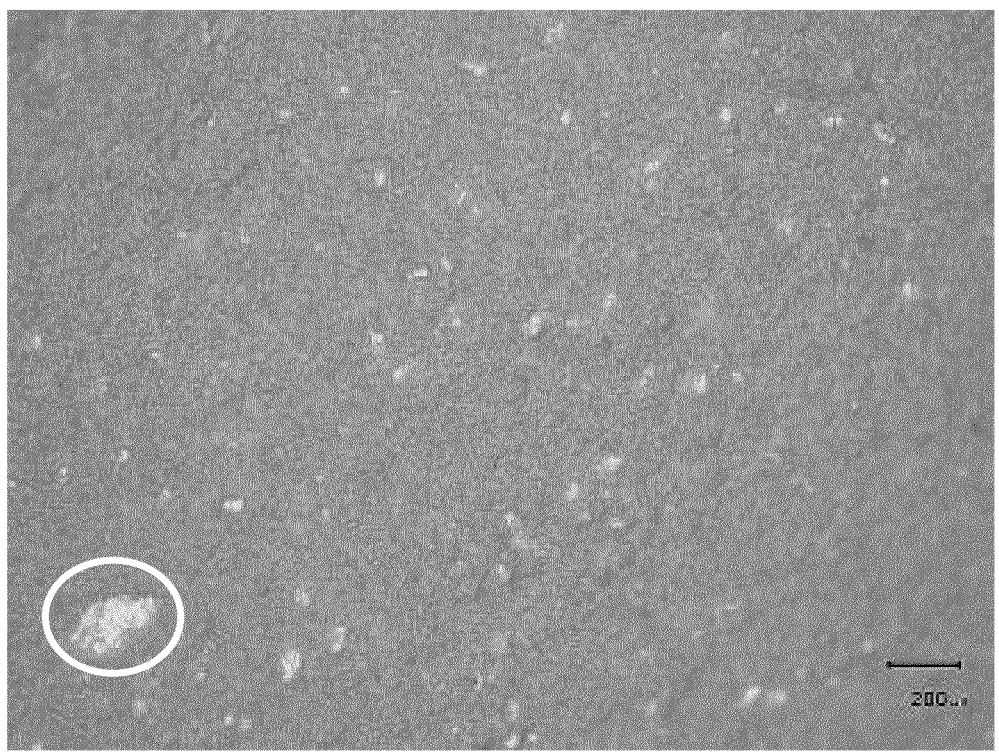
FIG. 12 is a photograph showing a surface of the target of Comparative Example 1 after a sputtering process for 20 hours.

FIG. 11 is a photograph showing a surface of the target of Example 1 after a sputtering process for 20 hours. FIG. 12 is a photograph showing a surface of the target of Comparative Example 1 after a sputtering process for 20 hours.

Referring to FIGS. 11 and 12, nodules were not observed at the target of Example 1 after a sputtering process for 20 hours. In contrast, nodules (in the white circle) were observed at the target of Comparative Example 1. The nodules may function as defects deteriorating reliability of an oxide semiconductor layer. Thus, it can be noted that an oxide semiconductor layer formed from the target of Example 1 may improve reliability of an element including such a semiconductor layer.

EXPERIMENT 2

Forming a Thin Film Transistor

A thin film transistor including a semiconductor layer including IZTO and having a thickness of about 500 Å. The thin film transistor was annealed at about 300° C. for about 1 hour.

An electron mobility of the thin film transistor was about 22.41 $cm^2/V \cdot s$. Furthermore, a shift value of a threshold voltage of the thin film transistor was no more than about 3.5 volts (V) when the thin film transistor was exposed to a light of about 25,000 nit at about 60° C. for about 1 hour.

Thus, it can be noted that an exemplary embodiment of a thin film transistor manufactured according to the invention may have high electron mobility and reliability.

Exemplary embodiments of the invention may be used for a display device such as a LCD or an OLED display device.

The foregoing is illustrative of the invention and is not to be construed as limiting thereof. Although a few exemplary embodiments have been described, those skilled in the art will readily appreciate from the foregoing that many modifications are possible in the exemplary embodiments without materially departing from the novel teachings and advantages of the invention. Accordingly, all such modifications are intended to be included within the scope of the invention. In the claims, means-plus-function clauses are intended to cover the structures described herein as performing the recited function and not only structural equivalents but also functionally equivalent structures.

What is claimed is:

1. A thin film transistor comprising:
   a gate electrode;
   a channel overlapped with the gate electrode and comprising an indium-zinc-tin oxide sourced from a source comprising a single phase indium-zinc-tin oxide;
   a source electrode contacting the channel; and
   a drain electrode spaced apart from the source electrode and contacting the channel,
   wherein the single phase indium-zinc-tin oxide of the source is represented by the following Chemical Formula 1

$(x)ZnIn_2O_4(1-x)Zn_2SnO_4$, wherein $0<x<0.45$.  Chemical Formula 1

2. The thin film transistor of claim 1, wherein the indium-zinc-tin oxide of the channel is amorphous.

3. The thin film transistor of claim 1, wherein the single phase indium-zinc-tin oxide of the source is crystalline.

4. The thin film transistor of claim 1, wherein the electron mobility of the channel is about 10 $cm^2/V·s$ to about 40 $cm^2/V·s$.

5. A display substrate comprising:
   a gate electrode on a base substrate;
   a channel overlapped with the gate electrode and comprising indium-zinc-tin oxide sourced from a source comprising a single phase indium-zinc-tin oxide;
   a source electrode contacting the channel;
   a drain electrode spaced apart from the source electrode and contacting the channel; and
   a pixel electrode electrically connected to the drain electrode,
   wherein the single phase indium-zinc-tin oxide of the source is represented by the following Chemical Formula 1

$(x)ZnIn_2O_4(1-x)Zn_2SnO_4$, wherein $0<x<0.45$.  Chemical Formula 1

6. The display substrate of claim 5, wherein the indium-zinc-tin oxide of the channel is amorphous.

7. The display substrate of claim 5, wherein the single phase indium-zinc-tin oxide of the source is crystalline.

8. The display substrate of claim 5, wherein the electron mobility of the channel is about 10 $cm^2/V·s$ to about 40 $cm^2/V·s$.

9. The display substrate of claim 5, wherein the gate electrode is between the base substrate and the channel.

10. The display substrate of claim 9, further comprising an etch stopper on the channel,
    wherein the source and the drain electrodes partially cover the etch stopper.

11. The display substrate of claim 5, wherein
    the channel is between the gate electrode and the base substrate, and
    the channel, the source electrode and the drain electrode are in a same layer of the display substrate.

12. A method for manufacturing a thin film transistor, the method comprising:
    providing an oxide semiconductor layer from a source comprising a single phase indium-zinc-tin oxide; and
    patterning the oxide semiconductor layer to form a channel of the thin film transistor,
    wherein the single phase indium-zinc-tin oxide of the source is represented by the following Chemical Formula 1

$(x)ZnIn_2O_4(1-x)Zn_2SnO_4$ wherein $0<x<0.45$.  Chemical Formula 1

13. The method of claim 12, wherein the providing the oxide semiconductor layer comprises vapor deposition of the source.

14. The method of claim 13, wherein the single phase indium-zinc-tin oxide of the source is crystalline.

15. The method of claim 14, further comprising:
    annealing the oxide semiconductor layer at a temperature of about 100° C. to about 700° C.

16. A thin film transistor comprising:
    a gate electrode;
    a channel overlapped with the gate electrode and comprising an indium-zinc-tin oxide sourced from a source comprising a single phase indium-zinc-tin oxide;
    a source electrode contacting the channel; and
    a drain electrode spaced apart from the source electrode and contacting the channel
    wherein the indium-zinc-tin oxide of the channel is represented by the following Chemical Formula 1

$(x)ZnIn_2O_4(1-x)Zn_2SnO_4$, wherein $0<x<0.45$.  Chemical Formula 1

* * * * *